(12) United States Patent
Kwiatkowski et al.

(10) Patent No.: US 7,309,878 B1
(45) Date of Patent: Dec. 18, 2007

(54) 3-D READOUT-ELECTRONICS PACKAGING FOR HIGH-BANDWIDTH MASSIVELY PARALLELED IMAGER

(75) Inventors: Kris Kwiatkowski, Los Alamos, NM (US); James Lyke, Albuquerque, NM (US)

(73) Assignee: U.S. Department of Energy, Washington, DC (US)

( * ) Notice: Subject to any disclaimer, the term of this patent is extended or adjusted under 35 U.S.C. 154(b) by 282 days.

(21) Appl. No.: 10/901,309

(22) Filed: Jul. 26, 2004

(51) Int. Cl.
*H01L 29/04* (2006.01)

(52) U.S. Cl. .......................... 257/59; 257/72; 257/83; 257/258; 257/292

(58) Field of Classification Search ............... 257/684, 257/685, 686, 777, 784, 57, 59, 72, 83, 257, 257/290, 351, 368
See application file for complete search history.

(56) References Cited

U.S. PATENT DOCUMENTS 6,355,976 B1 * 3/2002 Faris ........................... 257/686
6,821,808 B2 * 11/2004 Nakamura et al. ............ 438/57
2003/0123792 A1 * 7/2003 Matsumoto et al. .......... 385/31

\* cited by examiner

*Primary Examiner*—Wai-Sing Louie
(74) *Attorney, Agent, or Firm*—Thomas S. O'Dwyer; James C. Durkis; Paul A. Gottlieb

(57) ABSTRACT

Dense, massively parallel signal processing electronics are co-packaged behind associated sensor pixels. Microchips containing a linear or bilinear arrangement of photo-sensors, together with associated complex electronics, are integrated into a simple 3-D structure (a "mirror cube"). An array of photo-sensitive cells are disposed on a stacked CMOS chip's surface at a 45° angle from light reflecting mirror surfaces formed on a neighboring CMOS chip surface. Image processing electronics are held within the stacked CMOS chip layers. Electrical connections couple each of said stacked CMOS chip layers and a distribution grid, the connections for distributing power and signals to components associated with each stacked CSMO chip layer.

27 Claims, 7 Drawing Sheets

3-D READOUT-ELECTRONICS PACKAGING FOR HIGH-BANDWIDTH MASSIVELY PARALLELED IMAGER

STATEMENT OF GOVERNMENT RIGHTS

The United States Government has rights in this invention pursuant to Contract No. W-7405-ENG-36 between the United States Department of Energy and the University of California for the operation of the Los Alamos National Laboratory.

FIELD OF THE INVENTION

The present invention is generally related to electronics fabrication and electronics component packaging. More particularly, the present invention is related to improvements in 3-D electronics packaging and methods and means of efficiently joining monolithic pixel and electronic substrates into a 3-D array.

BACKGROUND

The construction of the 2-Mpixel, >32-frame, 200 ns imaging system is complicated by the tremendous requirements on data recording bandwidth, as well as by equally severe demands on the instantaneous power (ground) that has to be delivered to front-end electronics and sensor during acquisition. The bandwidth demands during processing imply that, for flash radiography, a considerable number of frames might be stored momentarily within the confines of the pixel imaging electronics. This in turn requires the ability to dedicate large amounts of silicon area to every pixel in a dense imager. It is not known whether this requirement can be met by traditional packaging concepts, such as the "camera-on-a-chip" or the traditional (hybrid) focal plane array (FPA). The signal conditioning, and analog storage or digitization and ~1 kilobits digital storage require, for each pixel, significantly more surface area than is currently available in the footprint of a unit pixel cell.

Normally, a "camera-on-a-chip" is a monolithic integrated circuit (IC) in which the semiconductor elements formed contribute both to detection (conversion of photon energy to electronic charge) and processing (manipulation and extraction of information from charge). These "camera-on-a-chip" devices exploit the considerable sophistication of modern IC fabrication processes to perform many sophisticated processing functions, in theory, but are however limited by the most significant constraint that all processing must fit within the confines of the pitch of a pixel unit cell. In other words, if a unit pixel cell was a 100 micron ($\mu$m) square, then all electronic circuits for the pixel-unique processing must co-reside in a 100×10 $\mu m^2$ area.

It is possible to perform additional processing "away" from the limited area of the unit pixel cell, subject to the significant limitations of interconnections used to access each pixel. The interconnection limitations become quite severe as the number of pixels grows, and the limited availability of physical wire channels force significant compromises in the level of sophistication of processing and the frame rate of imaging operations possible. Ideally, therefore, it would be desirable to confine processing to the unit pixel cell and to employ simpler methods of extracting post-processed information from these unit cells.

If it were possible to amplify, extract, store, and compress the information of many individual frames for each pixel within its own unit cell, then it would be possible, in principle, to sequence the readout of this information from each pixel in a time-multiplexed fashion over a relative small number of wires (proportional in number to the square root of the number of pixels in a square focal plane array). Achieving the increased functionality requires either making the unit cell very large or finding a way to fit more circuitry within the same unit area of a pixel. The first approach is clearly unsatisfactory, as it is generally desired to achieve the most aggressive (i.e., small) unit pixel size possible to improve spatial resolution, while maintaining good light collection efficiency. Hence, the second approach is often considered.

One scheme for increasing the amount of circuitry in a planar projection (i.e., the unit area) is proposed by the current inventors and involves 3-D arrangement of silicon. The stacking of silicon to increase the utilization of surface is not unlike the concept of high-rise buildings and multi-level parking structures, which seek to more effective use an otherwise limited piece of real estate. Of course, any additive processing increases the number of steps needed for construction and in general 3-D approaches are expensive due to their additive processing requirements. The aim of the present inventors is therefore to provide the advantages of 3-D packaging of circuitry close to the pixel, reducing the complexity of interconnections while providing for the greatly expanded potential to devote effective more circuitry to each pixel.

SUMMARY OF INVENTION

According to unique embodiments of the present invention, "camera-on-a-chip" systems that increase the functionality per pixel through three-dimensional (3-D) stacking are possible. In accordance with features of the present invention, an array of photo-sensitive cells are disposed on a stacked CMOS ship's surface at a 45° degree angle from light reflecting mirror surfaces formed on a neighboring CMOS chip surface. Image processing electronics are held within the stacked CMOS chip layers. Electrical connections couple each of said stacked CMOS chip layers and a distribution grid, the connections for distributing power and signals to components associated with each stacked CSMO chip layer.

According to another feature of the present invention, the sophistication of co-integrated detector electronics is improved by permitting the merging of improved detection, signal conditioning, amplification, storage, digitization, and processing on a per-pixel basis over a large, dense array of detector pixels.

In accordance with yet another aspect of the present invention, pixelated energy detectors (e.g., photon detectors) and electronics are co-integrable within a common semiconductor fabrication process. The invention involves a particular 3-D scheme that involves forming an angled recess on the edge of a number of stacked dice or substrates. In this arrangement, the recesses on the edge expose detectors on the die/substrate surface and the non-exposed bulk sections of the stacked dice/substrates contain the processing electronics. The edge of the entire arrangement forms a focal plane array.

The methodologies described herein are superior to strictly monolithic and hybridized 2-D focal plane arrays, since in these existing 2-D schemes, it is necessary to confine the amount of electronics devoted to each pixel within the physical area corresponding to a single pixel unit cell. By using a 3-D methods as provided for and described herein, it is possible for those skilled in the art to greatly increase the effective area per unit pixel, which thereby permits a greater range of applications, including extremely fast imaging.

In accordance with benefits of the present invention, it is then possible to implement storage buffers, more sophisticated amplifiers, on-board processing facilities, and other circuitry so as to greatly extend the utility of these combined detector-electronics systems. This is possible because the amount of physical real estate for implementing electronics per pixel is greater. In previously described and practiced 3-D implementations, however, the means for achieving assemblies has been complicated, leading to complexities affecting the cost of constructing a practical assembly. The present invention circumvents the complexity disadvantage of previously demonstrated art in 3-D arrangements, while providing the essential advantages of a 3-D scheme.

In accordance with additional benefit derived from the present invention, a range of applications are possible for the present invention including ultra-fast real time (very high frame rate) imaging systems (e.g., >one million frames/second) for dynamic radiography with high-explosives, "smart cameras" (imaging systems where much of the preprocessing is done within the assembly), extremely compact imagers, and potentially higher-performance detector-based instruments (due to the ability to allocate a larger effective region of electronics per pixel, co-located closely with the detector). Direct application can be had for the present invention in sophisticated scientific instruments and experiments and embedded systems platforms such as missiles, aircraft, spacecraft, munitions, and soldier systems. Commercial applications following the same performance arguments are abundant, particular in cases where high-speed in situ diagnostics might be required, test equipment, and a variety of industrial applications, e.g., diesel, combustion or jet engines.

DETAILED DESCRIPTION OF THE INVENTION

The purpose of the current invention is to inexpensively provide a means of increasing the functionality available in concepts related to "camera-on-a-chip" through a 3-D method. Described herein is an approach to reconcile the opposing demands for smaller, denser pixels and greater functionality.

Figure 1:
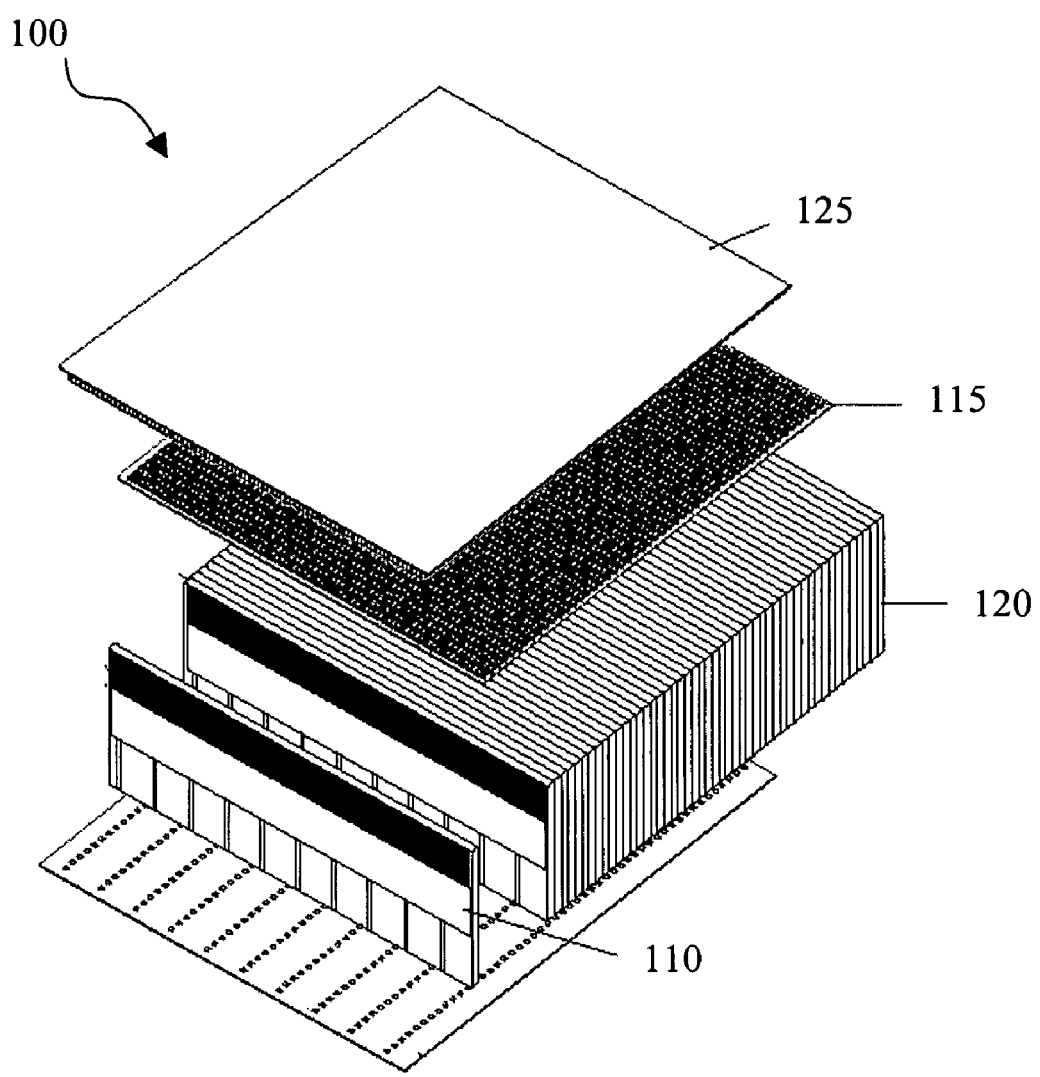
FIG. 1 illustrates a prior art approach to 3-D architecture of an imaging system.

Referring to FIG. 1 (labeled "Prior Art"), a vertically stacked chip architecture 100 has been used to address complex electronic component interconnection problems. In this scheme, the readout integrated circuits (ROICs) 110 are stacked vertically (like playing cards) into a cube configuration 120. Another integrated circuit die 115, a fully depleted high-pixel photo-diode focal plane array (FPA), is bump bonded to the top edge surface of the resulting ROIC cube 120. The stacked cube edge footprint is contained within the X-Y dimensions of the photo-diode FPA die 125, so as to permit tiling a number of similar assemblies into large arrays. Input/output (I/O) from these cubes is achieved through contacts made to the opposite edge-surface 105. Both edge surfaces in the ROIC cube are pre-conditioned using edge-HDI overlays, which provide an interconnection redistribution compatible with the FPA and "back-end" I/O signals. Mating external structures to the cube can be achieved through a high-density contact system, such a solder-bump array.

The hybrid approach of bonding the sensor chip to the ROIC cube as shown in FIG. 1 is complex and expensive. First, a separate FPA chip has to be fabricated. Then the process of the lamination of the HDI layer, laser via drilling, bump deposition and bonding, is complex, expensive and can lead to reliability problems. The present invention gets around the complexities of previous attempts at 3-D circuit co-integration, and greatly enhances the reliability of the imager employing this concept.

Figure 2A:
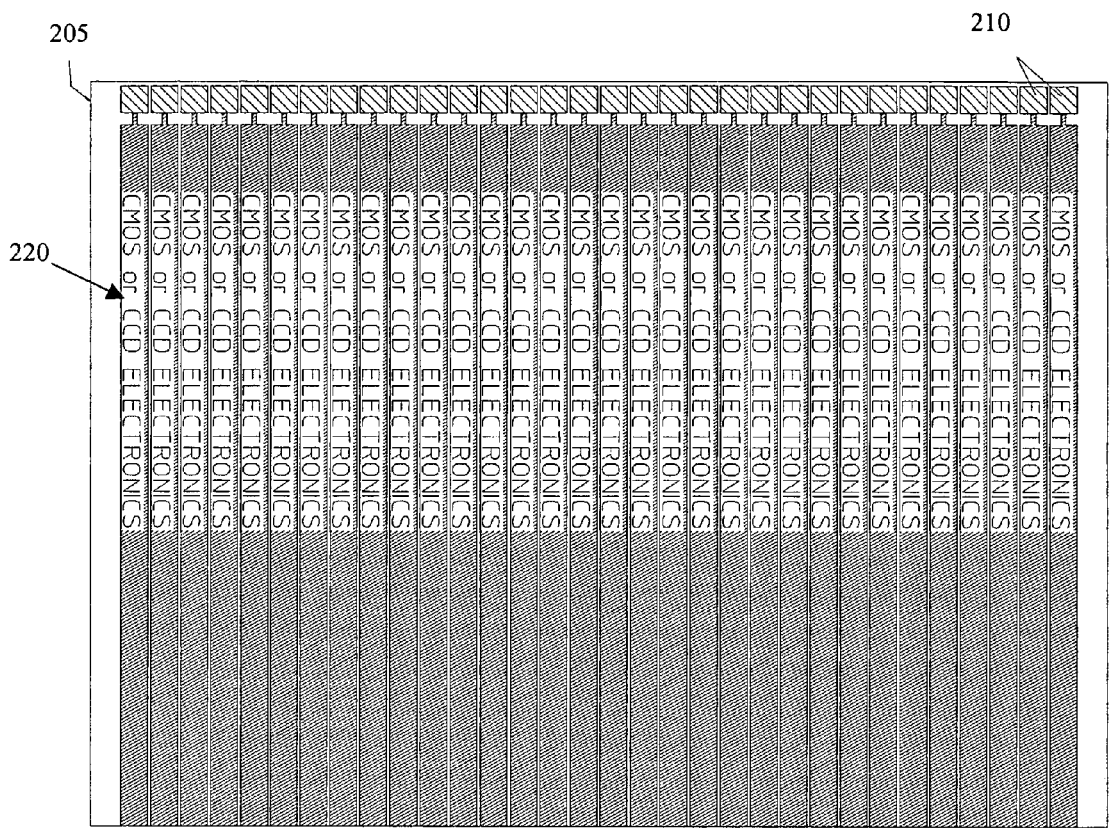
FIG. 2A illustrates a side view of the integrated chip (single pixel row arrangement) in accordance with features of the present invention.
Figure 2B:
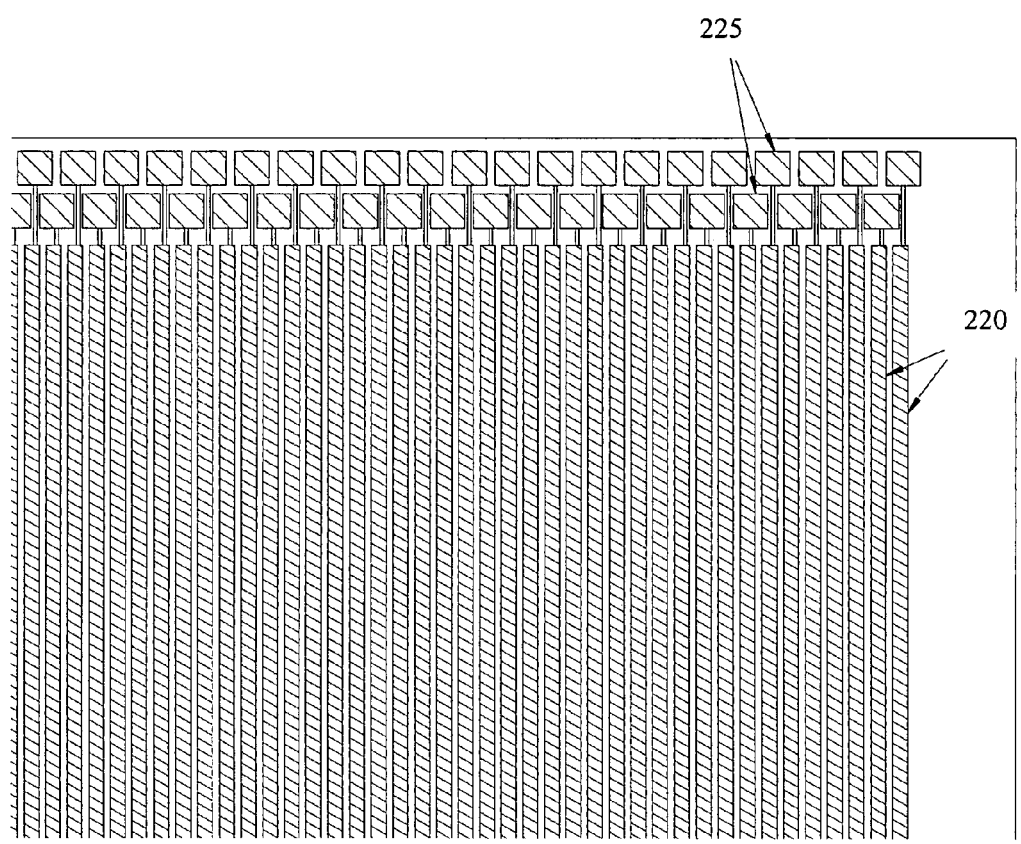
FIG. 2B illustrates a side view of the integrated chip implementing more than one pixel row in accordance with features of the present invention.

Referring to FIG. 2A, in the present inventive approach, the sensor 210 and associated electronics 220 are integrated onto a single chip 205. The chip 205 can house more than a single row of pixels 225 as shown in FIG. 2b. The chip can be adapted to operate as a fast APS (or CCD) linear (or bi-linear) CMOS imager, with individual electronics channels for each pixel. One can appreciate use of the linear chip as an "on-chip" solid-state streak camera.

Figure 3A:
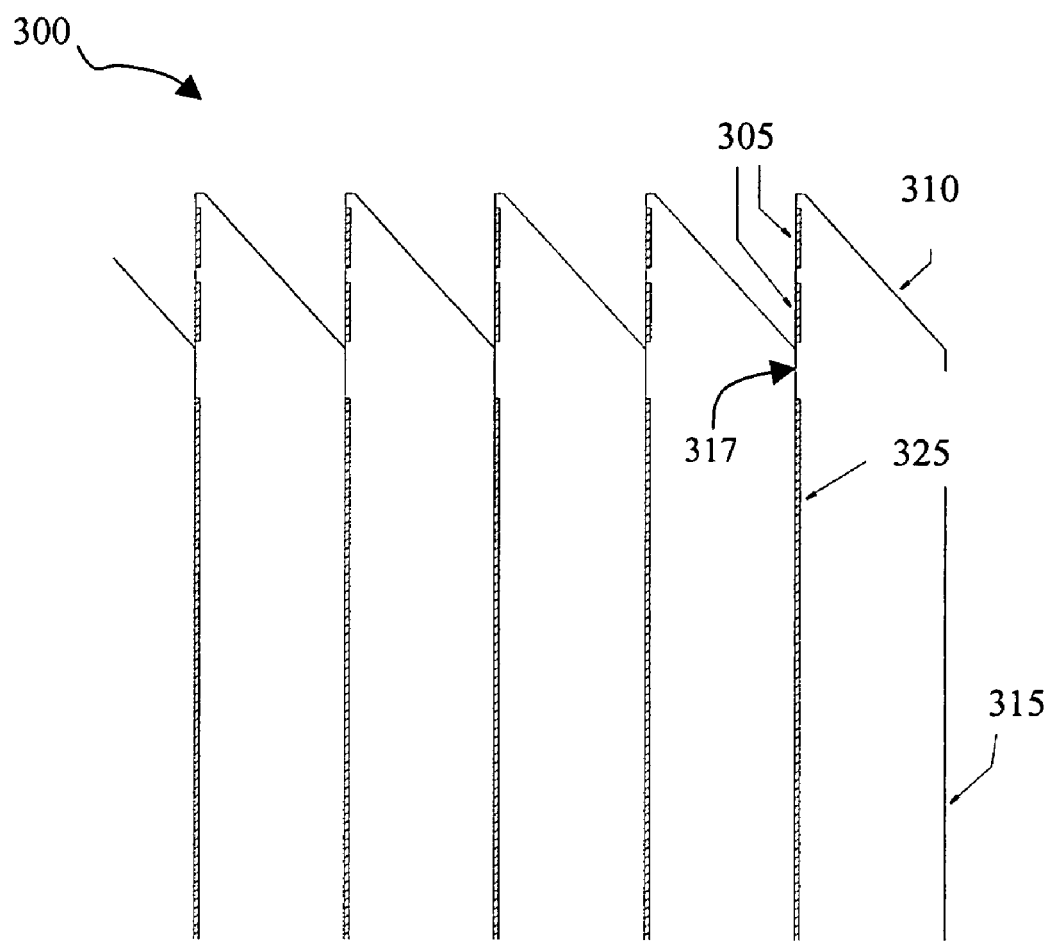
FIG. 3A illustrates a side view of the integrated chip-stack assembly in accordance with features of the present invention.

Referring to FIG. 3A, a cutout side view illustrates linear chips can be assembled into a stacked system 300 similar to the ROIC cube shown in FIG. 1. What is, however, uniquely different is that the top surface of each chip is micro-machined to provide a 45° turning mirror 310 for light (or IR radiation) rays impinging from above. Photosensitive cells (e.g., pixels) 305 are located on the vertical surface 317, opposite the 45° turning mirrors 310. The 45° surfaces 310 associated with turning mirrors 310 are obtainable by machining a groove of desired depth in the CMOS silicon wafer 315, with a 45° degree beveled saw, then parting it and thinning it to the final thickness (typically equal to the pixel pitch times the pixel vertical multiplicity). The mirror surface finish is obtainable by chemical-mechanical polishing (CMP) of individual chips and optional deposition of Aluminum or Gold reflective layers. The machined and polished individual die can be stacked into a cube using a process such as the GE 3-D ROIC-cube assembly scheme. Also shown in FIG. 3A, electronic components 325 (e.g., CMOS electronics or CCD storage cells) are positions on each wafer's 315 vertical surface 317.

Figure 3B:
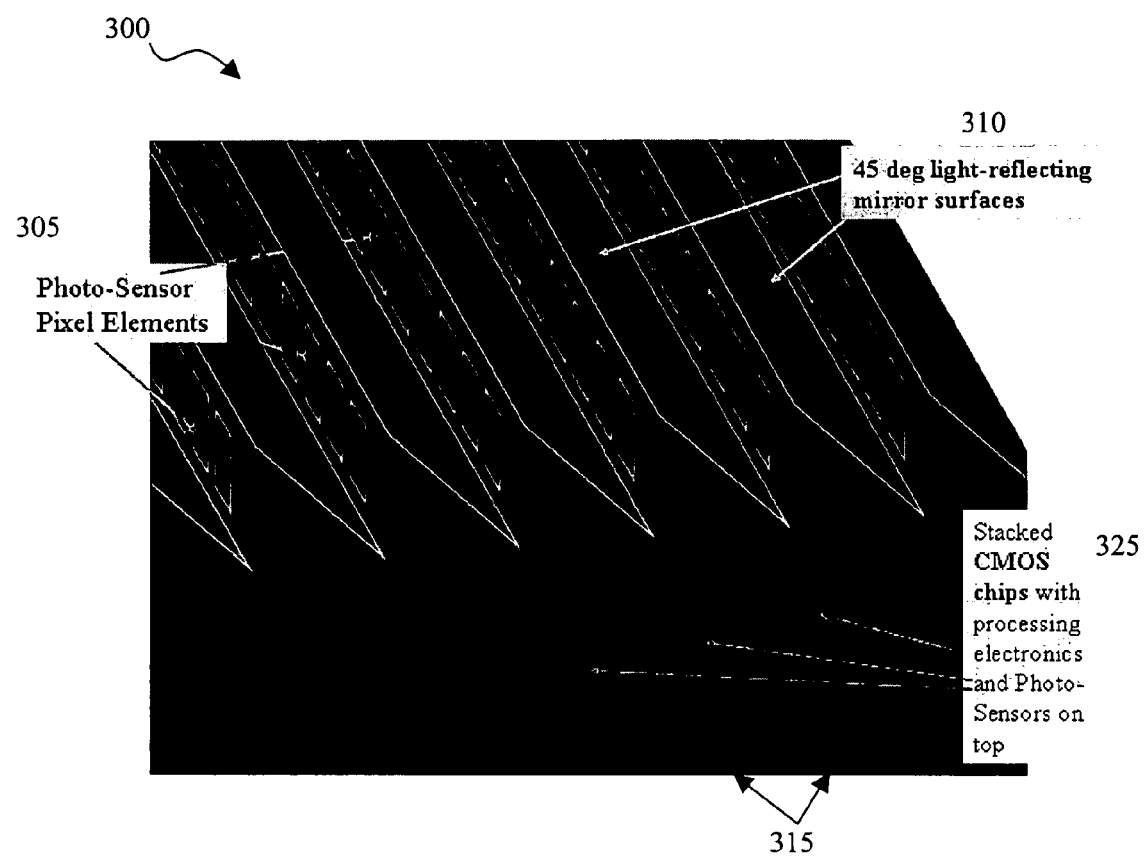
FIG. 3B illustrates a perspective 3D view of the integrated chip-stack assembly in accordance with features of the present invention.

Referring to FIG. 3B, a perspective view of the stacked system 300 is shown, wherein an array of photo-sensitive cells 305 (pixel elements) are shown disposed on the stacked CMOS chip's surface at a 45° angle from light reflecting mirror surfaces 310. Processing electronics 325 are held within the CMOS chip layers 315 as, generally indicated.

Several alternative methods for supplying the electrical connections (for power and signal conductors) can be utilized. In each case, the I/O is formed using the edge opposite the edge containing the patterned detectors. Five approaches are described below. Each scheme can affect performance, packaging, and complexity of a finished 3-D stack.

Figure 4:
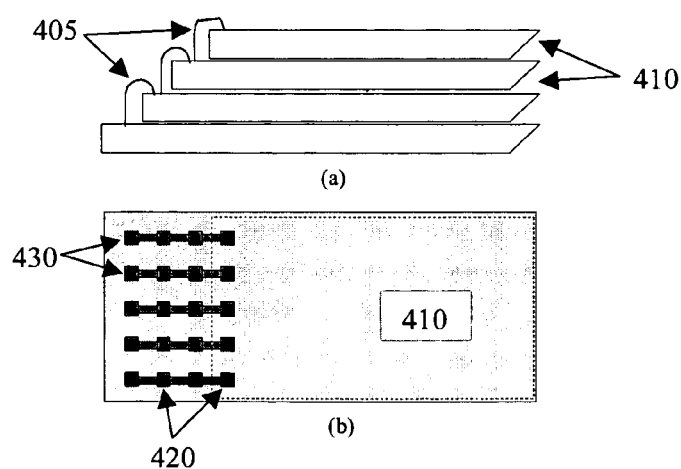
FIG. 4A illustrates a connection scheme in accordance with an embodiment of the present invention.
FIG. 4B illustrates a connection scheme in accordance with another embodiment of the present invention.

Staggered substrates. As shown in FIG. 4A, the staggered substrate approach involves forming a stair step 405 with each die/substrate 410 used to build the detector array 400. As shown in FIG. 4B, the exposed tops of each step are patterned with bond pad connections 420. Bond pad connections 420 can be formed between each substrate 410 by simply wire bonding the substrate to its nearest neighbors. The final external connections can be made on the bottom (longest substrate). This approach is simple, but has the primary disadvantage of requiring each substrate to have a slightly different length. Hence, an n-substrate stack requires n different lengths. The approach, however, can be achieved as suggested in FIG. 4B with one common design, by defining a minimum floor plan and extending each conductor 430 n times (e.g., four times are shown for each conductor), repeating the same bond pads n times at intervals correspond to the center-to-center pitch between steps.

Figure 5:
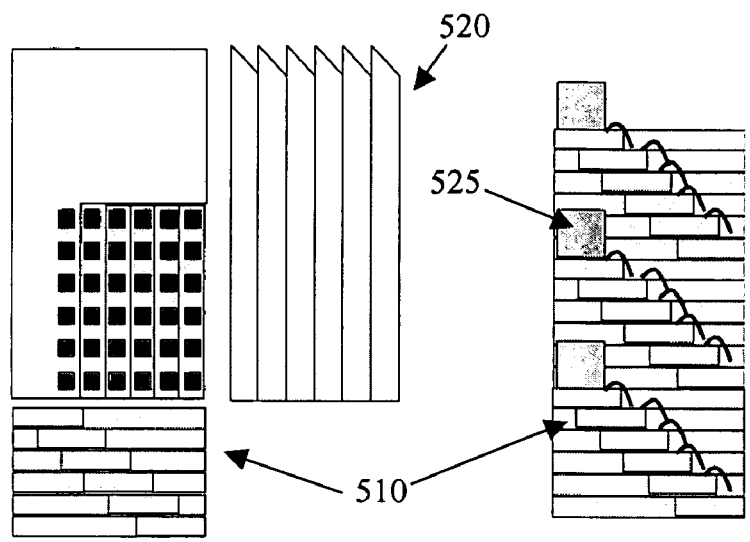
FIG. 5 illustrates a connection scheme in accordance with an embodiment of the present invention.

Two other variations involving staggered I/O interconnections are briefly described here. Referring to FIG. 5, the first variation on the basic wirebond scheme involves the formation of an etalon 510 using the back of the die whose position shifts depending on the position of a particular die within the stack 520. This scheme has the particular advantage of permitting the dense stack of several "cubes" (each cube is a stack of substrates into a single assembly) into a tile, with flexible circuitry connections 525 to each cube.

Figure 6:
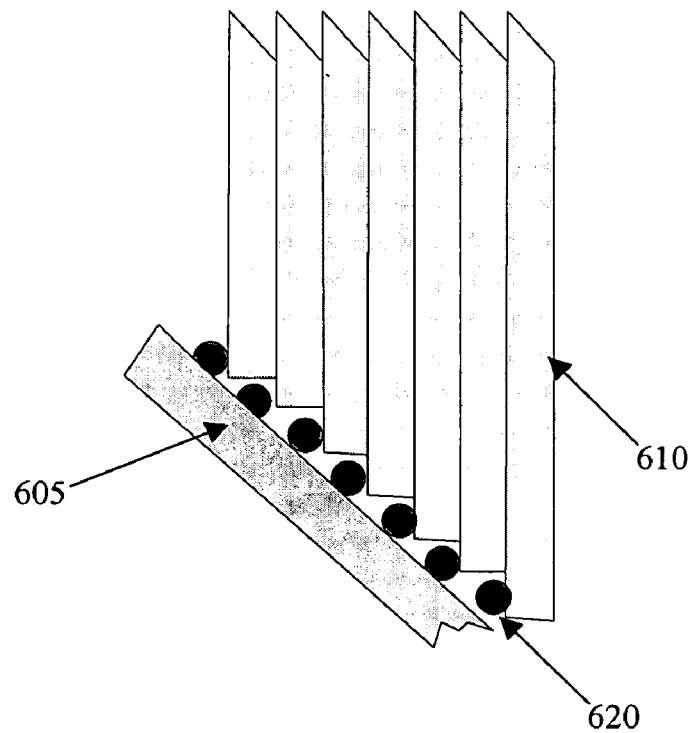
FIG. 6 illustrates a connection scheme in accordance with an embodiment of the present invention.

The second variation illustrated in FIG. 6 involves staggered substrate features. This variation involves the introduction of a flexible circuit 610 that interfaces to each substrate 605 using a solder ball array 620.

Figure 7:
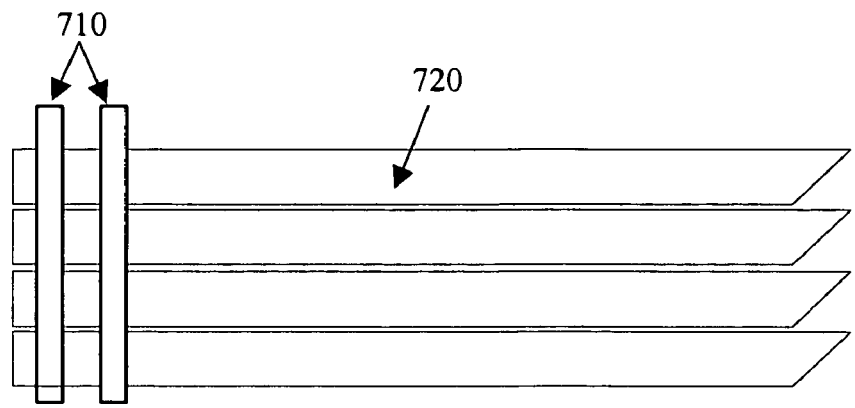
FIG. 7 illustrates a connection scheme in accordance with an embodiment of the present invention.

Feedthroughs. Referring to FIG. 7, feedthrough is a method that involves the bussed connection 710 of all power and signal lines on a per connection basis per substrate 720. In this case, the ith conductor of each substrate 720 is shorted to the ith conductor of all other substrates using a vertical connection 710 passing through all substrates after the substrates are assembled. This I/O scheme has the advantage of not requiring any physical differences in any particular substrate. The two disadvantages are that: (1) a reliable means of forming and maintaining connections is required that does not cause shorting between the feedthroughs and the individual substrates and (2) the integrated circuit within each substrate must have the ability to arbitrate a unique identification within a given stack. The latter requirement is necessary to avoid addressing conflicts (e.g., 3 μm diameter via in 100 μm thick Si substrates technology has become available in recent years).

Figure 8:
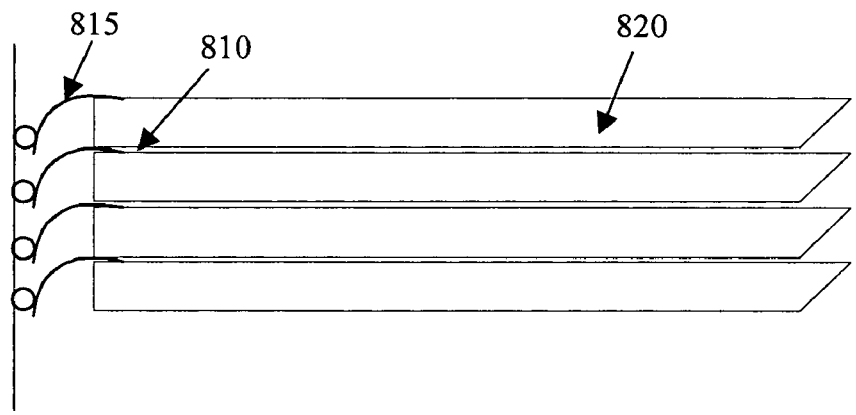
FIG. 8 illustrates a connection scheme in accordance with an embodiment of the present invention.
Figure 9:
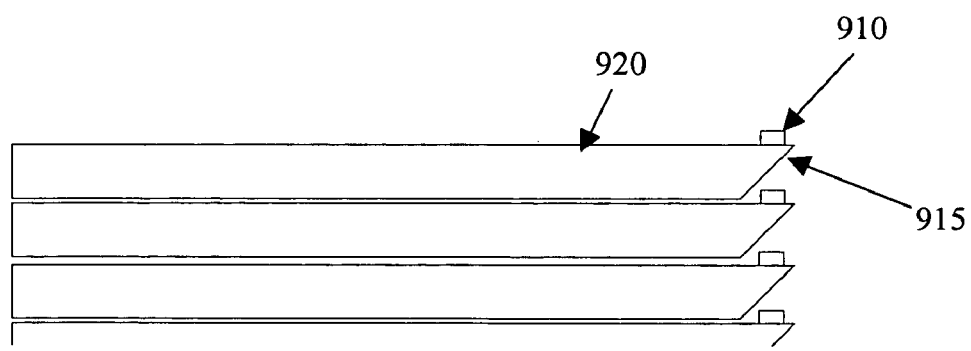
FIG. 9 illustrates a connection scheme in accordance with yet another embodiment of the present invention.

Flex circuitry "tails". Here it is necessary to form a patterned overlay onto each substrate that has a short "tail" that protrudes beyond the lateral extent of the substrate. FIG. 8 illustrates a location between substrate layers 810 wherein tails can be located and attached with an associated substrate. Upon assembly of the individual substrates, these tails, which contain the I/O electrical conductors, can be solder-attached to the presumed external substrate that would supply power and signal connections.

Direct solder attach. Referring to FIG. 8, the direct solder approach involves the formation of recesses 810 into substrates 820 similar to those used to expose the detectors on the opposite edge. These recesses 810 then expose bond pads 815, patterned with a solderable metallurgy. The substrate 820 is then electrically attached as shown in FIG. 8.

HDI interposer interconnects. Finally, the skilled in the art can reuse the HDI interposer interconnect technique (e.g., to adhere modules to the bottom as shown in FIG. 1). Because the connections 910 are on a relatively large grid of 400 μm, the assembly may be straightforward. However, this approach may require micro-machining/etching a small under-cut (recess) in the bottom part of the chip 920 to prevent laser drilled vias from being electrically shorted to the back 915 of the preceding substrate/chip 920.

The present invention is advantageous because it is simpler than previous packaging schemes. Only one basic substrate type is involved in the proposed scheme, whereas in other schemes it is necessary to combine a number of disparate assembly types. The proposed scheme has reduced parasitic interconnections between the detector and first stage of electronics, when compared to other 3-D schemes involving a method of joining the detector to the electronics.

While the present invention was conceived of as a means of efficiently joining monolithic pixel and electronic substrates into a 3-D array, it should also be appreciated that the invention can be implemented as a hybrid system.

The invention claimed is:

1. A method of joining combined pixel and electronic substrates into a 3-D array, comprising:
    forming an angled recess on the top edge of substrates to accommodate turning mirrors for reflecting light onto detectors located on the exposed vertical surface thereof and belonging to a stack of more than one stacked substrate;
    maintaining a non-exposed bulk electronic section of the more than one stacked substrate; and
    forming electrical connections between each of said stacked substrates and a distribution grid, the connection being formed for the distribution of power and signals to components including said detectors associated with each stacked substrate.

2. The method of claim 1 wherein the angled recess exposes the detectors on a substrates surface and wherein the non-exposed bulk section contains processing electronics and wherein the edge of the entire arrangement of stacked substrates forms a focal plane array.

3. The method of claim 2 wherein said detectors are photon detectors and electronics associated therewith are co-integrated onto the substrates using a common semiconductor fabrication process.

4. The method of claim 3 wherein the photon detectors and associated electronics are co-integrated onto the substrates using a common semiconductor fabrication process.

5. The method of claim 4 wherein the photon detectors are pixelated energy detectors.

6. The method of claim 1 wherein the step of forming electrical connection includes creating a stair step with each substrate used to build the detector array.

7. The method of claim 1 wherein the step of forming electrical connections includes creating a bussed connection of all power and signal lines on a per connection basis per substrate.

8. The method of claim 1 wherein the step of forming electrical connections includes forming a patterned overlay onto each substrate that has a short "tail" that protrudes beyond the lateral extent of the substrate.

9. The method of claim 1 wherein the step of forming electrical connections includes the formation of recesses into substrates similar to those used to expose the detectors on the opposite edge.

10. A method of assembly for incorporating electronic and photonic components into substrate layers of a stacked substrate system, comprising:
   micromachining the top surface of substrates to provide an angled recess to accommodate turning mirror for light rays impinging from above the stacked substrate system;
   locating photo-sensitive cells on the vertical surface of substrates, opposite said angled recess mounted turning mirrors;
   placing image processing electronics within each of the stacked substrate layers; and
   forming electrical connections between each of said stacked substrates and a distribution grid, the connection being formed for the distribution of power and signals to components associated with each stacked substrate.

11. The method of claim 10 wherein the step of micromachining includes providing a mirror surface finish that is obtainable on the top surface of the substrates by chemical-mechanical polishing of individual substrates and optional deposition of Aluminum or Gold reflective layers.

12. The method of claim 10 wherein the step of forming electrical connection includes creating a stair step on the substrates, said stair step usable to build the detector array.

13. The method of claim 10 wherein the step of forming electrical connection includes crating a bussed connection of all power and signal lines on a per connection basis per substrate.

14. The method of claim 10 wherein the step of forming electrical connection includes forming a patterned overlay onto the substrates that has a short "tail" that protrudes beyond the lateral extent of the substrates.

15. The method of claim 10 wherein the step of forming electrical connection includes the formation of recesses into substrates similar to those used to expose the detectors on the opposite edge.

16. The method of claim 10 wherein the step placing processing electronics associated with the photo-sensitive cells includes co-integration onto the substrates using a common semiconductor fabrication process.

17. The method of claim 10 wherein the photo-sensitive cells are pixelated energy detectors.

18. A method for assembling photonic and electronic components onto substrate layers of a stacked substrate system, comprising:
   forming an angled recess on the top edge of substrates to accommodate turning mirrors for reflecting light onto detectors located on the exposed vertical surface of the adjacent substrate and belonging to a stack of more than one staked substrate;
   maintaining a non-exposed section for placing electronics within each of the more than one stacked substrate; and
   providing electrical connections between each of said stacked substrates and a distribution grid, the connections being formed for the distribution of power and signals to said components associated with each stacked substrate.

19. A method for assembling a stacked photo-electronic system comprising:
   forming an array of photo-sensitive cells disposed on the end edge of a stacked CMOS chip's surface at a predetermined angle from light reflecting mirror surfaces formed on a neighboring CMOS chip surface;
   locating image processing electronics within the stacked CMOS chip layers; and
   providing electrical connections coupling each of said stacked CMOS chip layers and a distribution grid, the connection for distributing power and signals to components associated with each stacked CMOS chip layer.

20. The method of claim 19 wherein the step of providing said electrical connections includes adding polymer bumps located at the edge of a single substrate and used to interconnect the array of photo-sensitive cells to a cube, and the cube to a printed circuit board.

21. The method of claim 20 wherein the step of forming said array includes adding microchips containing a linear or bilinear arrangement of photo-sensitive cells, together with associated electronics, that are integrated into a 3-D structure.

22. The method of claim 1 wherein said stacked substrates are comprised of CMOS chip layers.

23. The method of claim 10 wherein said stacked substrate system is comprised of CMOS chip layers.

24. The method of claim 18 wherein said stacked substrate system is comprised of CMOS chip layers.

25. The method of claim 23 wherein the step of micromachining to provide said angled recess provides 45° degree surfaces associated with turning mirrors which are obtainable by machining a groove of desired depth in the CMOS silicon wafer, with a 45° degree beveled saw, then parting and thinning the wafer into a desired thickness.

26. The method of claim 10 wherein the entire edge of said stacked substrate system forms a focal plane array.

27. The method of claim 18 wherein the entire edge of said stacked substrate system forms a focal plane array.

* * * * *